United States Patent
Ishii et al.

(10) Patent No.: US 6,787,378 B2
(45) Date of Patent: Sep. 7, 2004

(54) METHOD FOR MEASURING HEIGHT OF SPHERE OR HEMISPHERE

(75) Inventors: Akira Ishii, Kusatsu (JP); Jun Mitsudo, Kusatsu (JP)

(73) Assignee: NEC Machinery Corporation, Shiga-ken (JP)

( * ) Notice: Subject to any disclaimer, the term of this patent is extended or adjusted under 35 U.S.C. 154(b) by 0 days.

(21) Appl. No.: 10/682,370

(22) Filed: Oct. 8, 2003

(65) Prior Publication Data

US 2004/0119985 A1 Jun. 24, 2004

(30) Foreign Application Priority Data

Oct. 10, 2002 (JP) ........................................ 2002-297709

(51) Int. Cl.$^7$ .............................................. H01L 21/66
(52) U.S. Cl. ...................... 438/14; 702/155; 702/166; 702/157; 434/213; 438/16; 382/146; 382/150; 382/154; 356/4.03; 356/625
(58) Field of Search ............................ 348/126, 86, 87, 348/92, 93, 94, 95, 129, 130, 131, 135, 139; 438/14, 16; 382/146, 150, 154; 356/4.03, 625; 702/155, 166, 157; 434/213; 29/593

(56) References Cited

U.S. PATENT DOCUMENTS

| | | | | |
|---|---|---|---|---|
| 4,737,648 A | * | 4/1988 | Smith et al. | 250/559.21 |
| 4,755,058 A | * | 7/1988 | Shaffer | 356/408 |
| 5,841,439 A | * | 11/1998 | Pose et al. | 345/418 |
| 5,936,726 A | * | 8/1999 | Takeda et al. | 356/237.2 |
| 6,025,905 A | * | 2/2000 | Sussman | 356/3.01 |
| 6,034,778 A | * | 3/2000 | Shin et al. | 356/600 |
| 6,137,528 A | * | 10/2000 | Ashizaki | 348/86 |
| 6,236,747 B1 | * | 5/2001 | King et al. | 382/149 |
| 6,278,482 B1 | * | 8/2001 | Ashizaki | 348/86 |
| 6,518,997 B1 | * | 2/2003 | Chow et al. | 346/126 |
| 2002/0101429 A1 | * | 8/2002 | Abdo | 345/581 |

* cited by examiner

*Primary Examiner*—Matthew Smith
*Assistant Examiner*—Victor V Yevsikov
(74) *Attorney, Agent, or Firm*—J.C. Patents

(57) ABSTRACT

A method is provided that allows a simple and inexpensive apparatus to measure the uniformity of the height-directional positions of spheres or hemispheres such as bump electrodes of a semiconductor device. The degree of focus is calculated from an image of bump electrodes 11*a* and 11*b* acquired at a first focusing position F1 using an imaging system. After that, the bump electrodes 11*a* and 11*b* and the imaging system is relatively moved closer or farther, and then the degree of focus is calculated from an image acquired at a second focusing position F2. The degrees of focus at these two focusing positions F1 and F2 are compared with each other. As a result, detected are the contour lines of the horizontal cross sections of the bump electrodes 11*a* and 11*b* at the height (F1+F2)/2 of the position of equal degree of focus indicated by PQ. On the basis of the shapes and/or sizes thereof, the height-directional positions of the bump electrodes 11*a* and 11*b* are measured. According to this method, the uniformity of the height-directional positions of the bump electrodes 11*a* and 11*b* are also measured.

8 Claims, 6 Drawing Sheets

METHOD FOR MEASURING HEIGHT OF SPHERE OR HEMISPHERE

BACKGROUND OF THE INVENTION

1. Field of the Invention

The present invention relates to a method for measuring the height of a sphere or a hemisphere and, in particular, to a method for measuring the height of a sphere or a hemisphere and for allowing an inexpensive apparatus to measure the uniformity of the height-directional positions of bump electrodes in a semiconductor device of a type such as BGA (ball grid array) and CSP (chip size package or chip scale package) having spherical or hemispherical bump electrodes.

2. Related Art of the Invention

In a semiconductor device of a type such as BGA and CSP joined through bump electrodes, a large number of spherical or hemispherical bump electrodes 11 provided on the back surface of the package 10 of a semiconductor device as shown in FIGS. 5(A) and 5(B) are connected to a large number of substrate electrodes 13 provided on a substrate 12 shown in FIGS. 6(A) and 6(B). In this configuration, troubles that the semiconductor device does not perform desired operation and functions have occurred in some ,cases depending on the state of connection between a large number of the spherical or hemispherical bump electrodes 11 and a large number of the substrate electrodes 13.

This causes the necessity of inspections of the state of connections between a large number of the spherical or hemispherical bump electrodes 11 and a large number of the substrate electrodes 13. Never the less, the height-directional dimension of each bump electrode 11 is as small as a few 100 $\mu$m. This prevents the inspection of the state of joining between the bump electrodes 11 and the substrate electrodes 13 in the state that the bump electrodes 11 are connected to the substrate electrodes 13 as shown in FIG. 6(B), unless a special inspection method is used such as X-ray inspection. This situation enhances the importance of the inspection of the height-directional dimensions of the bump electrodes 11 and their uniformity before the connection, in comparison with the case of the other prior art semiconductor devices.

Various types of height-directional dimension measuring apparatuses for bump electrode have been available commercially since a long time ago. These apparatuses achieve a sufficient measurement precision as precise as the order of magnitude of sub-micron by means of pencil beam scan and the like. The time necessary for the measurement is also sufficiently reduced. Nevertheless, they have a complicated mechanism, and hence cause cost problem.

On the other hand, as a distance measuring technique using an imaging system, a principle called "depth from focus" or "shape from focus" has been known since a long time ago (see, for example, IEEE Transaction on Pattern Analysis and Machine Intelligence, Vol. 16, No. 8, August 1994, pp. 824–831). In the technique using this principle, with changing the focus setting, the in-focus position of the focus setting is determined such that the blur of an image is minimized, so that the distance to an object is calculated. Various methods for evaluating the degree of focus have been devised so far, and the technique has already been commercialized as auto focus cameras (AFC's).

Here, the term "the degree of focus" indicates a value obtained by evaluating quantitatively the contrast of each pixel on the basis of the brightness distribution of an image.

In the use of the above-mentioned principle called "depth from focus" or "shape from focus", the in-focus position of the focus setting is searched and selected. That is, (1) a large number of images are acquired with changing the distance between an object and a camera, and then (2) "the degree of focus" is calculated for each of these images for each pixel of interest, so that a position is estimated where "the maximum degree of focus" is obtained. This estimation is performed, in general, using a technique of Gaussian fitting.

Thus, in this prior art method, (1) since plural images are acquired, a longer time is necessary for moving the camera and acquiring the images. Further, (2) the algorithm for estimating the maximum degree of focus causes a heavy load to the processor, and hence increases the process time.

Meanwhile, the absolute values of the height-directional dimensions of the bump electrodes 11 need to fall within a predetermined range relative to a design value. However, the height-directional dimensions themselves can be controlled, for example, by adjusting plating time in case that the bump electrodes 11 are formed by plating, or alternatively by controlling the pre-fusion-joining diameters of metallic balls into a predetermined range in case that the bump electrodes 11 are formed by fusion joining.

Nevertheless, uniformity in the height-directional dimensions of a large number of bump electrodes 11 is difficult to be obtained at sufficient precision because of, for example, a variation in the height-directional dimensions easily caused by a variation in the plating electric current depending on the location of arrangement of the bump electrodes 11 in case that the bump electrodes 11 are formed by plating. Further, in order to ensure the connection characteristic between the bump electrodes 11 and the substrate electrodes 13, the height-directional positions of the top points of a large number of the bump electrodes 11 are more important than the absolute values of respective height-directional dimensions of the bump electrodes 11. More specifically, what is important is uniformity in the height-directional positions of the top points of a large number of the bump electrodes 11.

SUMMARY OF THE INVENTION

With considering the a above-mentioned situation, an object of the invention is to provide a method for measuring the height of a sphere or a hemisphere and for permitting sufficiently precise measurement of the uniformity of the height-directional positions of spheres or hemispheres such as bump electrodes of a semiconductor device by means of an apparatus less expensive than prior art apparatuses.

The first aspect of the invention is a method for measuring the height of a sphere or a hemisphere, comprising the steps of: acquiring two images, at diverse height-directional positions of focal plane, of a first sphere or hemisphere and a second sphere or hemisphere; calculating the degree of focus at each point; subtracting the degree of focus of the second image from that of the first image; calculating the contour of horizontal cross sections of the spheres or hemispheres on the basis of the position of equal degree of focus; and calculating the height of the spheres or hemispheres on the basis of the size of the contour.

The term "the position of equal degree of focus" indicates the point where the difference between the degree of focus of the image at the first focusing position and that at the second focusing position acquired in the above-mentioned distance measuring method equals zero. As a result, "the position of equal degree of focus" equals the position of the sphere or the hemisphere at the middle position (height) between the first focal plane and the second focal plane.

In contrast to the prior art, the present method for measuring the height of a sphere or a hemisphere does not measure precisely the height-directional dimension itself of a sphere or a hemisphere. However, the method permits the measurement of the height-directional positions of bump electrodes with a measurement precision of approximately ±10 μm, which permits the evaluation of the connection characteristic between the bump electrodes and substrate electrodes. This allows a simple and inexpensive apparatus to evaluate the uniformity of the height-directional positions of a large number of bump electrodes.

The second aspect of the invention is a method for measuring the height of a sphere or a hemisphere, wherein after the degree of focus of the first image is acquired, the sphere or the hemisphere and an imaging system are relatively moved closer or farther, and then the degree of focus of the second image is acquired.

The statement "the sphere or the hemisphere and an imaging system are relatively moved closer or farther" includes that the sphere or the hemisphere is moved closer to or farther from the imaging system, that the imaging system is moved closer to or farther from the sphere or the hemisphere, and that both of the sphere or the hemisphere and the imaging system are moved closer to or farther from each other.

The present method for measuring the height of a sphere or a hemisphere allows a single imaging system to acquire the degrees of focus of the first and the second images. This reduces the cost of the configuration of the imaging system.

The third aspect of the invention is a method for measuring the height of a sphere or a hemisphere, wherein the degrees of focus of the first and the second images are acquired through a beam splitter by a plurality of imaging systems.

According to the present method for measuring the height of a sphere or a hemisphere, an optical path having a diverse optical path length is formed separately for each of a plurality of the imaging systems by means of the beam splitter. This permits simultaneous acquisition of the degrees of focus of the first and the second images by means of a plurality of the imaging systems. This avoids the necessity of moving relatively the sphere or the hemisphere and the imaging system closer or farther after the first image is acquired. This simplifies the operation, and reduces the height measurement time.

The fourth aspect of the invention is a method for measuring the height of a sphere or a hemisphere, wherein the degrees of focus of a first color image and a second color image having an optical path length difference through a glass substrate having a color-dependent refractive index are acquired by a color imaging system.

According to the present method for measuring the height of a sphere or a hemisphere, the optical path length difference caused by the color-dependent refractive index of the glass substrate is utilized. This allows the color imaging system composed of two or three CCD's to acquire the degrees of focus of the first and the second images simultaneously. This avoids the necessity of moving relatively the sphere or the hemisphere and the imaging system closer or farther. This simplifies the operation, and reduces the height measurement time. The size of the apparatus is also reduced.

The fifth aspect of the invention is a method for measuring the height of a sphere or a hemisphere, wherein the sphere or the hemisphere is a bump electrode of a semiconductor device.

The present method for measuring the height of a sphere or a hemisphere permits sufficiently precise measurement of the uniformity of the height-directional positions of spherical or hemispherical bump electrodes of a semiconductor device by means of an apparatus simpler and less expensive than prior art apparatuses. This reduces the cost of measurement of the uniformity of the height-directional positions of a plurality of bump electrodes.

Further, the present method for measuring the height of a sphere or a hemisphere allows semiconductor device packages having a large variation in the height-directional positions of bump electrodes to be detected and eliminated before the joining of the bump electrodes of semiconductor devices to substrate electrodes. This improves the yield obtained after the joining of bump electrodes to substrate electrodes.

DETAILED DESCRIPTION OF THE INVENTION

Embodiments of a method for measuring the height of a sphere or a hemisphere according to the invention are described below with reference to the drawings. The principles of a method for measuring the height of a sphere or a hemisphere according to the invention are described first with reference to FIGS. 1 and 2. Then, the method for measuring the height of a sphere or a hemisphere is described more specifically with reference to FIGS. 3 and 4.

Figure 1A:
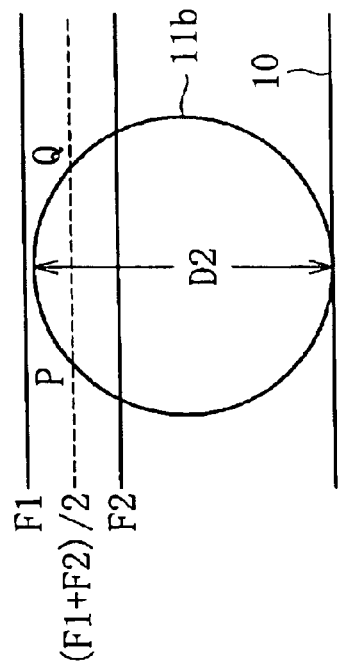
FIG. 1(A) is an expanded front view illustrating the principles of a method for measuring the height of a sphere or a hemisphere according to the invention.
Figure 1B:
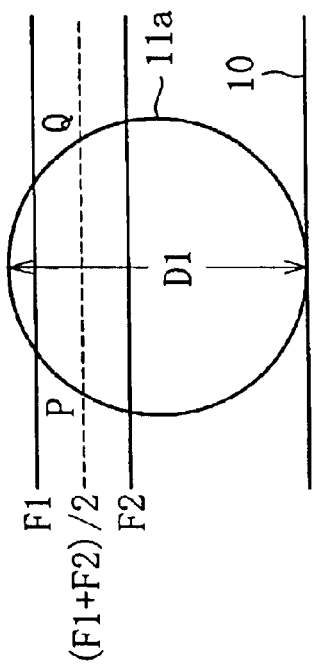
FIG. 1(B) is an expanded front view illustrating the principles of a method for measuring the height of a sphere or a hemisphere located at a position different from that of FIG. 1(A).

FIGS. 1(A) and 1(B) are expanded front views of a semiconductor device having spherical bump electrodes. In FIGS. 1(A) and 1(B), numeral 10 indicates the package of the semiconductor device on which spherical bump electrodes 11a and 11b are formed. In this example, the diameters D1 and D2 of the bump electrodes 11a and 11b are identical to each other (D1=D2) Nevertheless, the height of the package 10 is different at each of these locations owing to the waviness of the package 10 surface, so that the height-directional positions of the bump electrodes 11a and 11b are different from each other.

First in FIG. 1(A), the degree of focus is calculated from an image of the bump electrode 11a acquired at a first focusing position F1 using an imaging system such as a CCD camera. After that, the bump electrode 11a and/or the imaging system is moved, and then the degree of focus is calculated from an image of the same bump electrode 11a acquired at a second focusing position F2. Then, obtained is a within-image position where the difference between these degrees of focus equals zero. As a result, detected is the contour of the horizontal cross section of the bump electrode 11a at the height-directional position indicated by P-Q, that is, at the height of (F1+F2)/2. When the bump electrode 11a has the shape of a perfect sphere, the contour is a circle. This detecting method utilizes the height-directional symmetry of the degree of focus, that is, the fact that two positions departing up and down by the same distance from the position of "the maximum degree of focus" have the same degree of focus.

Here, the statement "the difference between the degrees of focus equals zero" should be understood, in practice, as "the absolute value of the difference between the degrees of focus is smaller than a predetermined threshold value". Accordingly, the statement "the difference between the degrees of focus equals zero" in this specification includes the case that "the absolute value of the difference between the degrees of focus is smaller than a predetermined threshold value".

Figure 2:
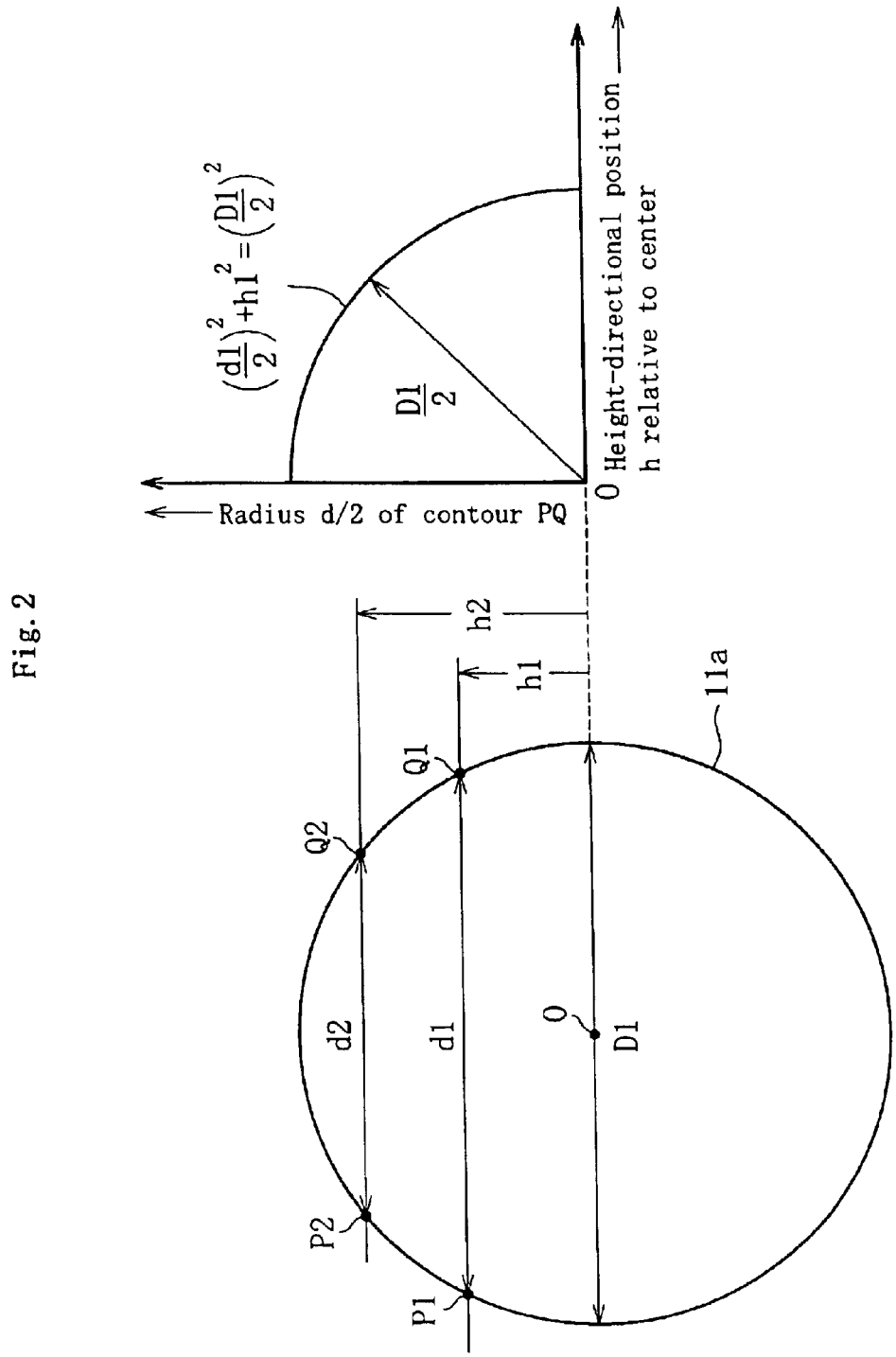
FIG. 2 is a schematic diagram illustrating the principles of a method for measuring the height of a sphere or a hemisphere according to the invention.

In FIG. 2, the two bump electrodes 11a and 11b are located at diverse sites where the height of the package 10 surface is different from each other. The figure shows that a specific relation exists among the respective diameters d1 and d2 of the contours P1Q1 and P2Q2 of these bump electrodes and the respective height-directional positions h1 and h2 of the contours P1Q1 and P2Q2 relative to the center O. Accordingly, the height-directional position h1 or h2 of the contour P1Q1 or P2Q2, respectively, can be estimated by measuring the diameters d1 and d2.

This estimation is achieved also using the relation of the height-directional positions h1 and h2 with the areas encompassed by the contours P1Q1 and P2Q2 in place of the relation with the diameters d1 and d2.

The present method does not directly measure the top point itself of the bump electrode 11a or the height-directional position of the top point. However, the method permits the estimation of the height-directional position of the bump electrode 11a on the basis of the contour shape of the horizontal cross section near the top point on the assumption that the diameter D1 of the bump electrode 11a is known. An experiment has shown that when no deformation is present near the top point of the bump electrode 11a, this estimation of the height-directional position of the bump electrode 11a is achieved with a precision of ±10 µm.

Figure 5A:
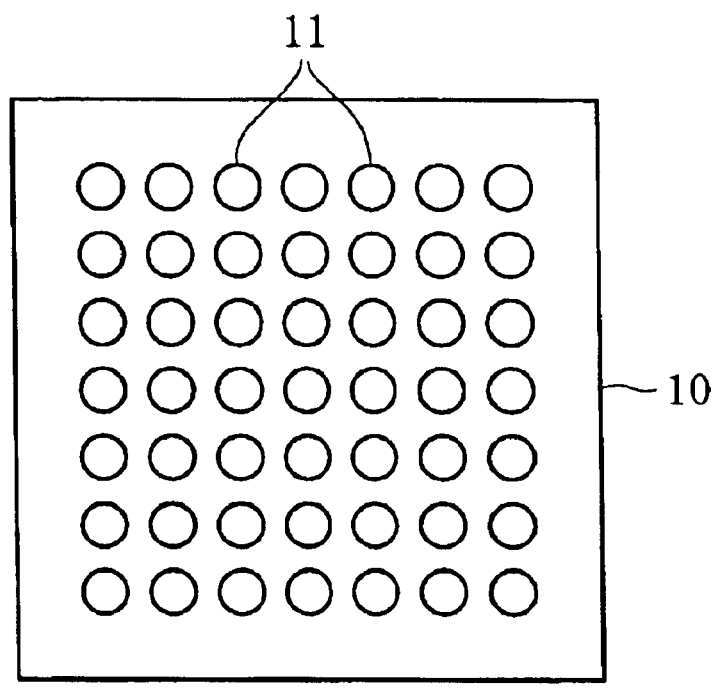
FIG. 5(A) is a plan view of a semiconductor device having bump electrodes.
Figure 5B:
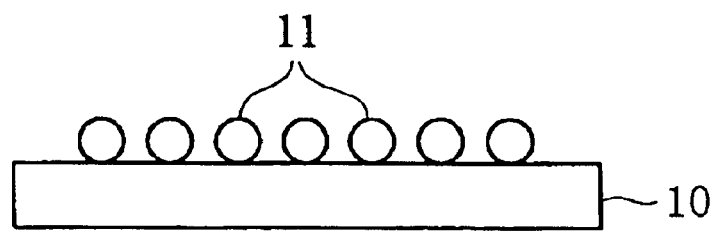
FIG. 5(B) is a front view of a semiconductor device having bump electrodes.
Figure 6A:
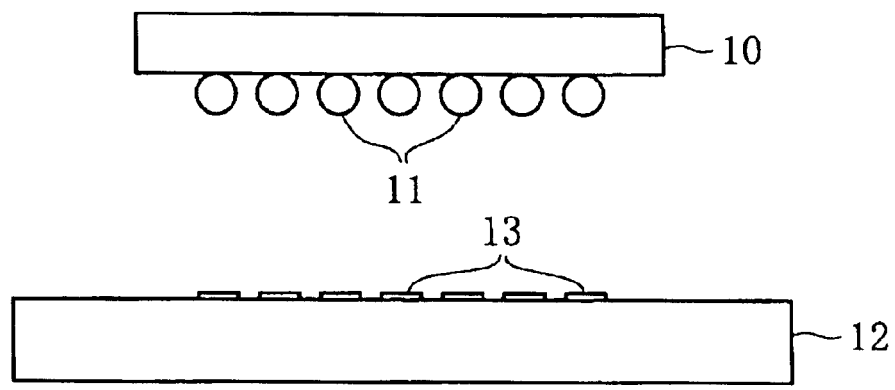
FIG. 6(A) is a front view showing the situation before the semiconductor device of FIG. 5 is connected to substrate electrodes.
Figure 6B:
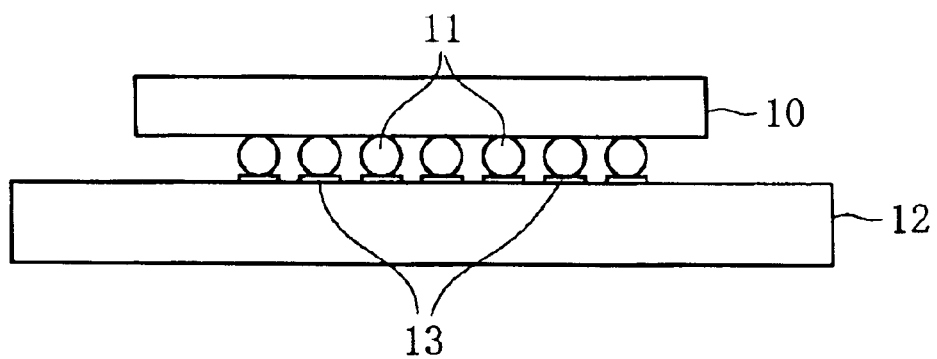
FIG. 6(B) is a front view showing the situation after the semiconductor device of FIG. 5 is connected to substrate electrodes.

This measurement precision of ±10 µm is practically sufficient for evaluating the joining characteristic between the bump electrodes 11a and substrate electrodes 13 (see FIGS. 5 and 6) in a practical semiconductor device having bump electrodes 11a.

In FIG. 1(B), similarly to the case of FIG. 1(A), the degree of focus is calculated from an image of the bump electrode 11b acquired at a first focusing position F1. After that, the imaging system is moved, and then the degree of focus is calculated from an image of the same bump electrode 11b acquired at a second focusing position F2. Then, obtained is a within-image position where the difference between these degrees of focus equals zero. As a result, detected is the contour PQ of the horizontal cross section at the height of (F1+F2)/2.

Thus, this method does not directly measure the top point itself of the bump electrode 11b or the height-directional position of the top point. However, the method permits the estimation of the height-directional position of the bump electrode 11b on the basis of the contour shape of the horizontal cross section near the top point on the assumption that the diameter D2 (=D1) of the bump electrode 11b is known. When no deformation is present near the top point of the bump electrode 11b, this estimation of the height-directional position of the bump electrode 11b is achieved with a precision of +10 µm similarly to the above-mentioned case.

As such, the above-mentioned method of comparing the height-directional position of the bump electrode 11a with the height-directional position of the bump electrode 11b allows a simple and inexpensive apparatus using a CCD camera to measure and evaluate the uniformity of the height-directional positions of the bump electrodes 11a and 11b.

The method shown in FIGS. 1(A) and 1(B) requires the operations of: acquiring the degree of focus of an image of bump electrodes 11 at a first focusing position F1 using an imaging system such as a CCD camera; moving the bump electrodes 11 and the imaging system such as a CCD camera closer or farther relative to each other; acquiring the degree of focus of an image at a second focusing position F2; obtaining sequences of within-image dots where the difference between these degrees of focus equals zero; and detecting these dot sequences as the contour images of the horizontal cross sections of the bump electrodes 11 at the height-directional position of (F1+F2)/2 indicated by P-Q.

If after the acquiring of the image of the bump electrodes 11 at the first focusing position F1, the image at the second focusing position F2 could be acquired without moving the imaging system such as a CCD camera relative to the bump electrodes 11, the measurement time would be advantageously reduced.

Figure 3:
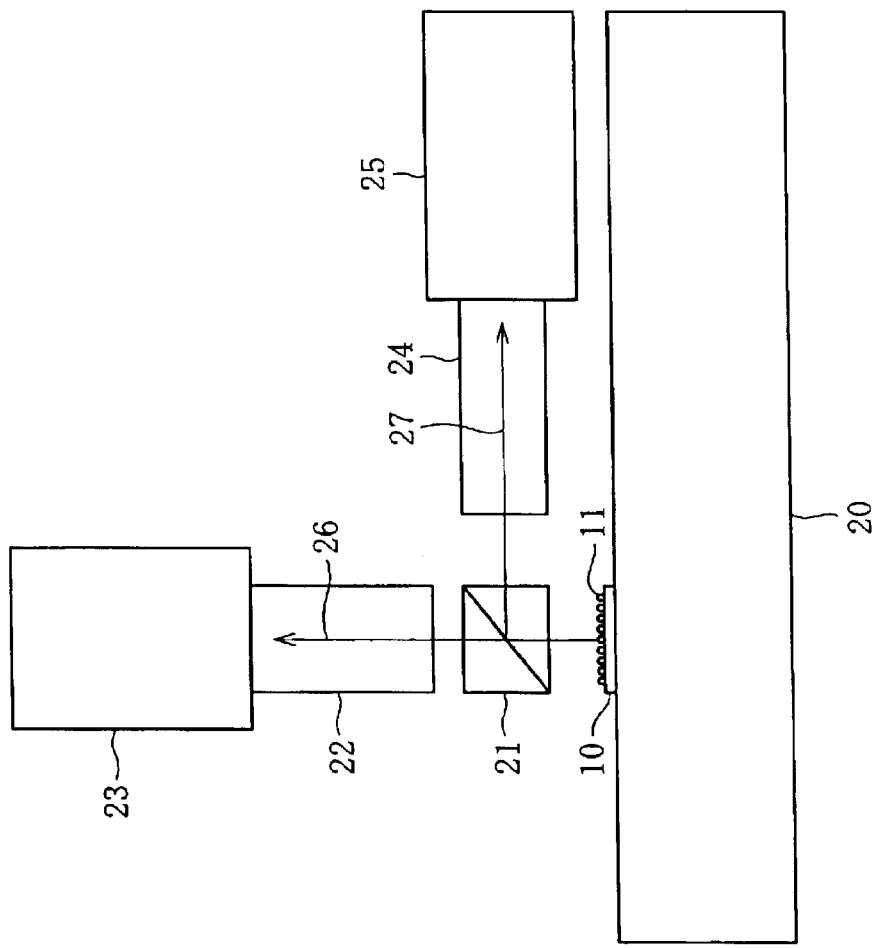
FIG. 3 is a schematic diagram specifically illustrating the principles of a method for measuring the height of a sphere or a hemisphere according to the invention.

FIG. 3 is a schematic diagram illustrating a first measuring method that satisfies such a desire. In FIG. 3, numeral 20 indicates a sample stage, at a predetermined position of which the package 10 of a semiconductor device having bump electrodes 11 is mounted. A beam splitter 21 is arranged over the package 10. Over the beam splitter 21, a first imaging system 23 such as a CCD is arranged through a lens 22. In the horizontal vicinity of the beam splitter 21, a second imaging system 25 such as a CCD is arranged through a lens 24. It should be noted that when a telecentric optical system is used, the problem is resolved that the image size differs in these two optical systems owing to the difference in their focus.

The operation of this system is described below. The image of the bump electrodes 11 is acquired by the first imaging system 23 via a first optical path 26 extending straight through the beam splitter 21. At the same time, this image is acquired by the second imaging system 25 via a second optical path 27 formed by reflection in the beam splitter 21. At this time, when the distance between the beam splitter 21 and the lens 22 is set different from that between the beam splitter 21 and the lens 24 so that an optical path length difference is provided, two images at diverse focusing positions are acquired simultaneously. This permits the measurement and evaluation of the uniformity of the height-directional positions of the bump electrodes 11 in a simpler and faster manner in comparison with the method described above with reference to FIG. 1.

In the method of FIG. 3, two imaging systems have been used. However, if a single imaging system could acquire the two images, the configuration would advantageously become much simpler and the cost would be reduced further.

Figure 4:
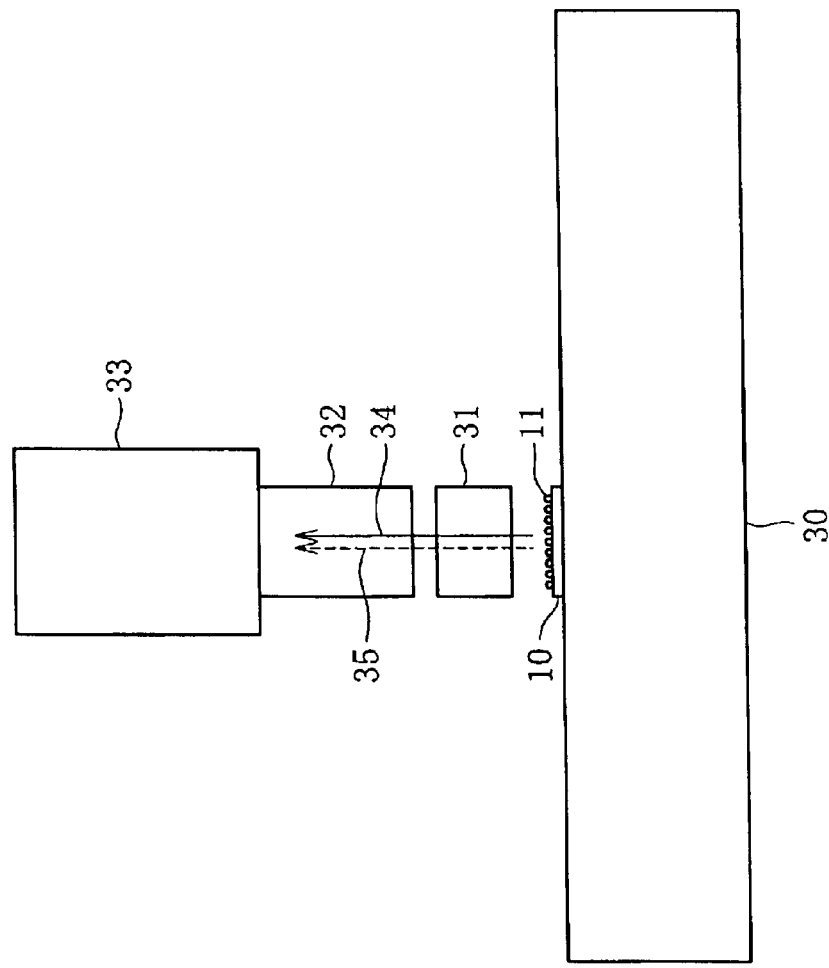
FIG. 4 is a schematic diagram specifically illustrating the principles of another method for measuring the height of a sphere or a hemisphere according to the invention.

FIG. 4 is a schematic diagram illustrating a second measuring method that satisfies such a desire. In FIG. 4, numeral 30 indicates a sample stage, at a predetermined position of which the package 10 of a semiconductor device having bump electrodes 11 is mounted. Over the package 10, arranged is a thick glass substrate 31 showing chromatic aberration, that is, having a color-dependent refractive index. Over the glass substrate 31, an imaging system 33 such as a three-CCD color camera is arranged through a lens 32.

The operation of this system is described below. In this example, the bump electrodes 11 are irradiated with red and blue LED's or the like. The irradiation wavelength of the red LED is 660 nm, and the refractive index of the glass substrate 31 for this irradiation is 1.5140. On the other hand, the irradiation wavelength of the blue LED is 480 nm, and the refractive index of the glass substrate 31 for this irradiation is 1.5228. Accordingly, when mixed light of red and blue emitted from the LED's passes through the glass substrate 31, the difference between these refractive indices causes an optical path length difference between the path 34 of the red image and the path 35 of the blue image of the bump electrodes 11. This optical path length difference is obtained as follows.

$$\text{optical path length difference} = (1.5228 - 1.5140) \times T \text{ (mm)}$$

where T denotes the thickness of the glass substrate 31.

When the thickness T of the glass substrate 31 is 12 [mm], an optical path length difference of 0.1056 [mm] is obtained. When the red image and the blue image are acquired via the two optical paths 34 and 35 having diverse optical path lengths by the imaging system 33, the images are spectrum-analyzed through a dichroic prism of the three-CCD color camera so as to be focused as two images of the same magnification factor but with diverse focusing positions respectively onto a CCD for red and a CCD for blue. Accordingly, this color imaging system can acquire the two images simultaneously. By adjusting the thickness of the glass substrate 31, the optical path length difference in the two images can be set arbitrarily.

When a green LED and a CCD for green are used in addition to the above-mentioned red LED, blue LED, CCD for red, and CCD for blue, three images having optical path length differences are acquired. This green image may be used in the measurement of the shapes of the bump electrodes 11 or in other purposes. For example, when a low-angle light source alone is composed of a green LED, the area where the bump electrodes 11 are present is extracted solely, so that the area processed in the height measurement is restricted and that the load to the processor is reduced.

The above-mentioned embodiments have been described for the case that the bump electrodes of a semiconductor device have a spherical shape. However, the invention is applicable also in the measurement of the uniformity of the height-directional positions of hemispherical bump electrodes.

Further, the invention is applicable also to spherical or hemispherical bump electrodes of an electronic device other than a semiconductor device. Furthermore, the invention is applicable also in the measurement of the uniformity of the height-directional positions of spheres or hemispheres other than bump electrodes.

A method for measuring the height of a sphere or a hemisphere according to the invention comprises the steps of: acquiring two images, at diverse height-directional positions of focal plane, of a first sphere or hemisphere and a second sphere or hemisphere; calculating the degree of focus at each point; subtracting the degree of focus of the second image from that of the first image; calculating the contour of horizontal cross sections of the spheres or hemispheres on the basis of the position of equal degree of focus; and calculating the height of the spheres or hemispheres on the basis of the size of the contour. This permits the measurement of the uniformity of the height-directional positions of spheres or hemispheres such as bump electrodes by means of an apparatus simpler and less expensive than prior art apparatuses.

In a method for measuring the height of a sphere or a hemisphere according to the invention, a single imaging system is used, and after the degree of focus of the first image is acquired, the sphere or the hemisphere and the imaging system are relatively moved closer or farther, and then the degree of focus of the second image is acquired. This causes a slight complexity in the operation, but allows a very simple and inexpensive apparatus to measure the height-directional position of a sphere or a hemisphere.

In a method according to the invention, the first and the second images of spheres or hemispheres are acquired through a beam splitter by a plurality of imaging systems, so that the two images are acquired simultaneously. This reduces the time necessary for the measurement of the uniformity of the height-directional positions of spheres or hemispheres in comparison with the case that a single imaging system is used, and that the sphere or the hemisphere and the imaging system are relatively moved closer or farther, and further that the degree of focus of the second image is then acquired.

In a method according to the invention, the degrees of focus of a first color image and a second color image having an optical path length difference through a glass substrate having a color-dependent refractive index are acquired by an imaging system. This allows a simpler and less expensive apparatus to acquire a plurality of images simultaneously, and reduces the time necessary for the measurement of the uniformity of the height-directional positions of spheres or hemispheres.

A method according to the invention allows the uniformity of the height-directional positions of the bump electrodes of a semiconductor device having spherical or hemispherical bump electrodes to be measured before the joining of the bump electrodes to substrate electrodes. This allows semiconductor devices having a large variation in the height-directional positions of bump electrodes to be eliminated before the joining. This improves the yield of semiconductor devices obtained after the joining, and reduces waste of resources associated with the dumping of defectives.

What is claimed is:

1. A method for measuring the height of a sphere or a hemisphere, comprising the steps of:
    acquiring two images, at diverse height-directional positions of focal plane, of a first sphere or hemisphere and a second sphere or hemisphere;
    calculating the degree of focus at each point;
    subtracting the degree of focus of the second image from that of the first image;
    calculating the contour of horizontal cross sections of the spheres or hemispheres on the basis of the position of equal degree of focus; and
    calculating the height of the spheres or hemispheres on the basis of the size of the contour.

2. A method for measuring the height of a sphere or a hemisphere according to claim 1, wherein after the degree of focus of the first image is acquired, the sphere or the hemisphere and an imaging system are relatively moved closer or farther, and then the degree of focus of the second image is acquired.

3. A method for measuring the height of a sphere or a hemisphere according to claim 2, wherein the sphere or the hemisphere is a bump electrode of a semiconductor device.

4. A method for measuring the height of a sphere or a hemisphere according to claim 1, wherein the degrees of focus of the first and the second images are acquired through a beam splitter by a plurality of imaging systems.

5. A method for measuring the height of a sphere or a hemisphere according to claim 4, wherein the sphere or the hemisphere is a bump electrode of a semiconductor device.

6. A method for measuring the height of a sphere or a hemisphere according to claim 1, wherein the degrees of focus of a first color image and a second color image having an optical path length difference through a glass substrate having a color-dependent refractive index are acquired by a color imaging system.

7. A method for measuring the height of a sphere or a hemisphere according to claim 6, wherein the sphere or the hemisphere is a bump electrode of a semiconductor device.

8. A method for measuring the height of a sphere or a hemisphere according to claim 1, wherein the sphere or the hemisphere is a bump electrode of a semiconductor device.

* * * * *